(12) United States Patent
Yu et al.

(10) Patent No.: US 6,187,663 B1
(45) Date of Patent: Feb. 13, 2001

(54) METHOD OF OPTIMIZING DEVICE PERFORMANCE VIA USE OF COPPER DAMASCENE STRUCTURES, AND HSQ/FSG, HYBRID LOW DIELECTRIC CONSTANT MATERIALS

(75) Inventors: Chen-Hua Yu; Syun-Ming Jang, both of Hsin-chu; Weng Chang; Yao-Yi Cheng, both of Taipei, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/234,059

(22) Filed: Jan. 19, 1999

(51) Int. Cl.[7] .................. H01L 21/4763; H01L 21/44; H01L 29/40
(52) U.S. Cl. ................ 438/624; 438/638; 438/687; 257/760
(58) Field of Search .................. 438/624, 638, 438/622, 634, 637, 687; 257/760, 758

(56) References Cited

U.S. PATENT DOCUMENTS

| | | | |
|---|---|---|---|
| 5,578,523 | 11/1996 | Fiordalice et al. | 437/190 |
| 5,741,626 | 4/1998 | Jain et al. | 430/314 |
| 5,753,967 | 5/1998 | Lin | 257/635 |
| 5,763,010 | 6/1998 | Guo et al. | 427/376.2 |
| 5,767,582 | 6/1998 | Lee et al. | 257/753 |
| 6,054,769 | * 4/2000 | Jeng | 257/758 |

* cited by examiner

Primary Examiner—Carl Whitehead, Jr.
Assistant Examiner—Neal Berezny
(74) Attorney, Agent, or Firm—George O. Saile; Stephen B. Ackerman

(57) ABSTRACT

A process for fabricating a copper damascene structure, embedded in two levels of low dielectric constant, composite insulator layers, has been developed. The process features the use of two levels of low dielectric constant, composite insulator layers, each comprised of an overlying fluorinated silicon glass, (FSG), layer, and an underlying, applied hydrogen silsesquioxane, (HSQ), layer, with a thin silicon oxynitride layer located between levels of the low dielectric constant, composite insulator layers. A wide diameter opening, of a subsequent dual damascene opening, is formed via dry etching procedures, performed in the upper level, composite insulator layer, with the dry etching procedure, selectively terminating at the appearance of the silicon oxynitride layer. The narrow diameter opening, of the dual damascene opening, is next formed in the silicon oxynitride layer, and in the lower level, composite insulator layer, via dry etching procedures. A copper structure is then formed in the dual damascene opening, embedded in levels of low dielectric constant, composite insulator layers.

18 Claims, 3 Drawing Sheets

METHOD OF OPTIMIZING DEVICE PERFORMANCE VIA USE OF COPPER DAMASCENE STRUCTURES, AND HSQ/FSG, HYBRID LOW DIELECTRIC CONSTANT MATERIALS

BACKGROUND OF THE INVENTION (1) Field of the Invention

The present invention relates to processes used to fabricate semiconductor devices, and more specifically to a process used to increase the performance of semiconductor device via use of more conductive metal structures, and lower dielectric constant, insulator layers.

(2) Description of the Prior Art

The continuing objectives of the semiconductor industry has been to increase the performance of semiconductor devices, while still maintaining, or reducing, the cost of these same semiconductor devices. The use of sub-micron features, or micro-miniaturization, used for semiconductor devices, has allowed the performance and cost objectives to be aggressively addressed. Devices with smaller features result in a reduction of performance degraded capacitances, evidenced by the higher performing metal oxide semiconductor field effect transistor, (MOSFET), devices, fabricated with sub-quarter micron channel lengths. In addition the use of sub-micron features result in a smaller semiconductor chip, however still possessing the same, or greater, device densities, than larger size semiconductor chips, fabricated using larger features. This allows more semiconductor chips to be realized from a specific size substrate, thus reducing the cost of a specific semiconductor chip.

Micro-miniaturization has in part, been accomplished via advances in specific semiconductor disciplines, such as photolithography, and dry etching. The use of more advanced exposure cameras, as well as the use of more sensitive photoresist materials, have allowed sub-micron images to be routinely achieved in photoresist layers. In addition, the development of more advanced dry etching tools, and processes, have allowed the sub-micron images, in overlying photoresist layers, to be successfully transferred to underlying conductive and insulating materials, used for the fabrication of semiconductor devices. However, in addition to the advances in semiconductor fabrication disciplines, specific structural developments, as well as material upgrades, are still needed to continue to improve device performance and lower cost.

The use of copper interconnect structures, exhibiting lower resistivity than aluminum, or tungsten counterparts, and the use of low dielectric constant, (low k), materials, such as hydrogen silsesquioxane, (HSG), or fluorinated silicate glass, (FSG), such as silicon oxyfluoride, have been used to decrease RC, (resistance—capacitance), delays. The more conductive copper interconnect structures, with increased electromigration resistance, compared to aluminum based counterparts, allow narrower metal interconnect structures to be used. However the definition of copper structures, using conventional photolithographic and dry etching procedures, can prove difficult when defining narrow metal interconnect structures, therefore the use of damascene metal structures, avoiding the difficulties encountered with conventional patterning procedures, has gained attention. This invention will describe a process in which a copper damascene structure, (single, or dual damascene), is embedded in a two level, composite insulator layer, with each component of the two level, composite insulator layer, having a low dielectric constant. The two levels of the composite insulator layer, are separated by a thin, silicon oxynitride layer, used as an etch stop layer, when forming the upper, wide diameter opening, of a dual damascene pattern, in the top level of composite insulator layer. In addition each level of the composite insulator layer, is comprised with two dielectric layers, each being a low k material. This is used to optimize capacitance, as well as to allow the use of an underlying HSQ layer, with a dielectric constant of about 2.8, to be integrated into the fabrication sequence, residing underlying a protective FSG layer, which in addition also features a low dielectric constant. Prior art, such as Fiordalice et al, in U.S. Pat. No. 5,578,523, as well as Lin, in U.S. Pat. No. 5,753,967, describe the use of low k dielectric constant layers, with a hard mask used between these layers. However those prior arts do not describe the use of two levels of low k dielectric constant layers, which each low k dielectric constant layer, a composite layer, comprised of two low k layers, each needed to achieve both capacitance objectives, as well as reducing fabrication complexities.

SUMMARY OF THE INVENTION

It is an object of this invention to improve the performance of a semiconductor device, via use of a copper damascene structure, and via the use of low k dielectric layers, used for passivation.

It is another object of this invention to use two levels, of composite insulator layers, to embed the copper damascene structure, with a wide diameter, copper interconnect shape, embedded in the top level of the two level, composite insulator layer, and with a narrow diameter, copper via structure, embedded in the bottom level of the two level, composite insulator layer.

It is still another object of this invention to use a composite insulator layer, for each level of the two level, composite insulator layer, comprised of an overlying, low k dielectric layer of fluorinated silicon glass, (FSG), and an underlying, low k dielectric layer of hydrogen silsesquioxane, (HSQ).

It is still yet another object of this invention to use a thin silicon oxynitride layer, between the levels of composite insulator layer, to serve as an etch stop for the patterning of the wide diameter, damascene opening, in the top level of the two level, composite insulator layer.

In accordance with the present invention a method of fabricating a copper damascene structure, in a low k, two level, composite insulator layer, is described. A first level, composite insulator layer, comprised of an overlying layer of FSG, and an underlying layer of HSQ, is formed on the top surface of an underlying insulator layer, as well as on the top surface of an lower level, metal interconnect structure, which is located in, or located on the underlying insulator layer. After deposition of a thin layer of silicon oxynitride, a second level, composite insulator layer, again comprised of an overlying FSG layer, and an underlying HSQ layer, is formed on the silicon oxynitride layer. A wide diameter opening, is next formed in the second level, composite insulator layer, via a selective, dry etching procedure, using the silicon oxynitride layer, as an etch stop. A narrow diameter opening is next formed, via dry etching procedures, in the silicon oxynitride layer, and in the first level, composite insulator layer, exposing a portion of the top surface of the lower level, metal interconnect structure. After deposition of a copper layer, completely filling the openings in the two level, composite insulator layer, unwanted regions of copper are removed from the top surface of the second level, composite insulator layer, resulting in a copper damascene structure, embedded in a low k, two level, composite insulator layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
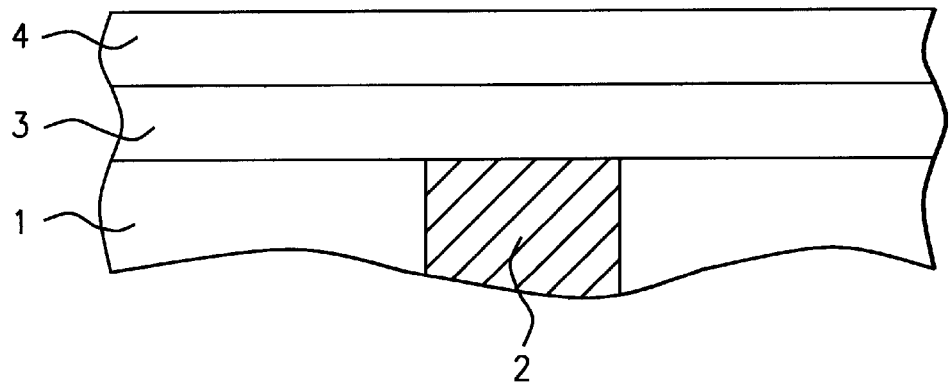
FIGS. 1–6, which schematically, in cross-sectional style, show key stages of fabrication, used to create a copper damascene structure, embedded in a low k, two level, composite insulator layer.

The process used to fabricate a copper damascene structure, embedded in a low k, two level, composite insulator layer, will now be described in detail. FIG. 1, schematically shows a lower level, metal interconnect structure 2, embedded in insulator layer 1. Lower level, metal interconnect structure 2, can also be located on insulator 1, if desired. A dielectric layer 3, comprised of a first hydrogen silsesquioxane, (HSQ), is applied on the top surface of insulator layer 1, and on the top surface of lower level, metal interconnect structure 2, via spin on procedures, at a thickness between about 2000 to 6000 Angstroms. First HSQ layer 3, has a dielectric constant between about 2.8 to 3.0. Next another dielectric layer 4, comprised of a first fluorinated silicon oxide glass, (FSG), layer, is deposited on first HSQ layer 3. First FSG layer 4, can be a silicon oxyfluoride layer, deposited via plasma enhanced chemical vapor deposition, (PECVD), or high density plasma chemical vapor deposition, (HDPCVD), procedures, to a thickness between about 1000 to 5000 Angstroms. First FSG layer 4, is deposited at a temperature between about 350 to 450° C., using $SiF_4$, $SiH_4$, $O_2$, as reactants, in an argon ambient, resulting in an FSG layer with a dielectric constant between about 3.5 to 3.7. The lower level, composite insulator layer, comprised of FSG layer 4, overlying, and protecting HSQ layer 3, offers a lower dielectric constant than other widely used low k materials, such as silicon dioxide, with a dielectric constant of about 3.9. Therefore the lower level, composite insulator layer will offer improved performance, in terms of lower capacitance, compared to other dielectric layers.

Figure 2:
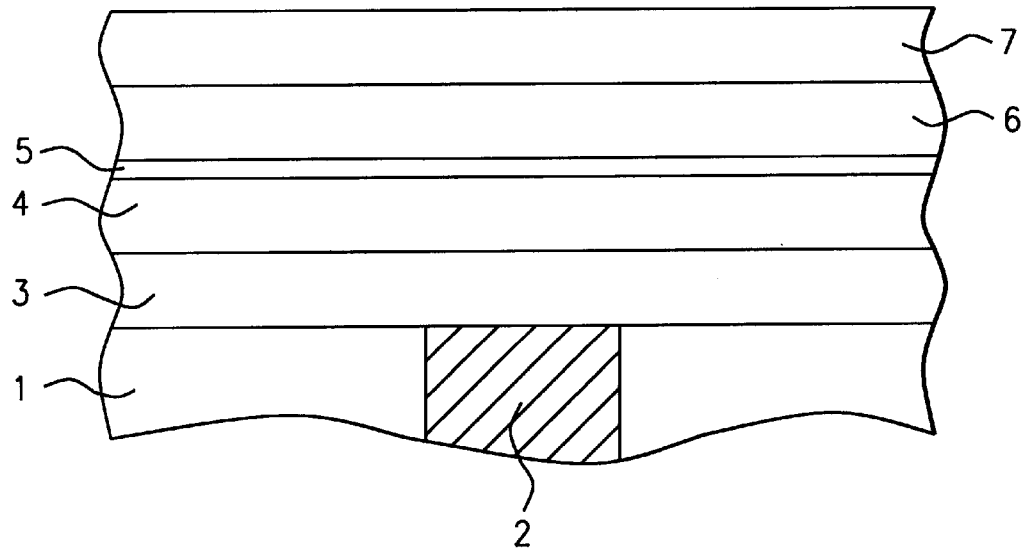

A silicon oxynitride, ($SiO_xN_y$), layer 5, is next deposited via PECVD procedures, at a temperature between about 300 to 450° C., to a thickness between about 500 to 1000 Angstroms, overlying first FSG layer 4. This is schematically shown in FIG. 2. Silicon oxynitride layer 5, is deposited using $SiH_4$, $NH_3$, and $O_2$, as reactants, with the resulting stoichiometry of the oxide, and nitride components, of the silicon oxynitride, between about 0 to 2. Silicon oxynitride layer 5, will subsequently be used as a hard mask, or as an etch stop, during a selective, dry etching procedure, used to create a subsequent opening in overlying materials, or silicon oxynitride layer 5, can be used as anti-reflective coating, (ARC layer), during the via photolithographic procedure. An upper level, composite insulator layer, comprised of an underlying, second HSQ layer 6, and an overlying, second FSG layer 7, is next formed on underlying silicon oxynitride layer 5. Second HSQ layer 6, is again applied via spin on procedures, to a thickness between about 2000 to 6000 Angstroms, with a dielectric constant, again between about 2.8 to 3.0. Second FSG layer 7, at a thickness between about 1000 to 5000 Angstroms, is again obtained via PECVD or HDPCVD procedures, at a temperature between about 350 to 450° C., using $SiF_4$, $SiH_4$, and $O_2$, as reactants, resulting in a second FSG layer, with a dielectric constant between about 3.5 to 3.7. The result of these depositions are schematically shown in FIG. 2.

Figure 3:
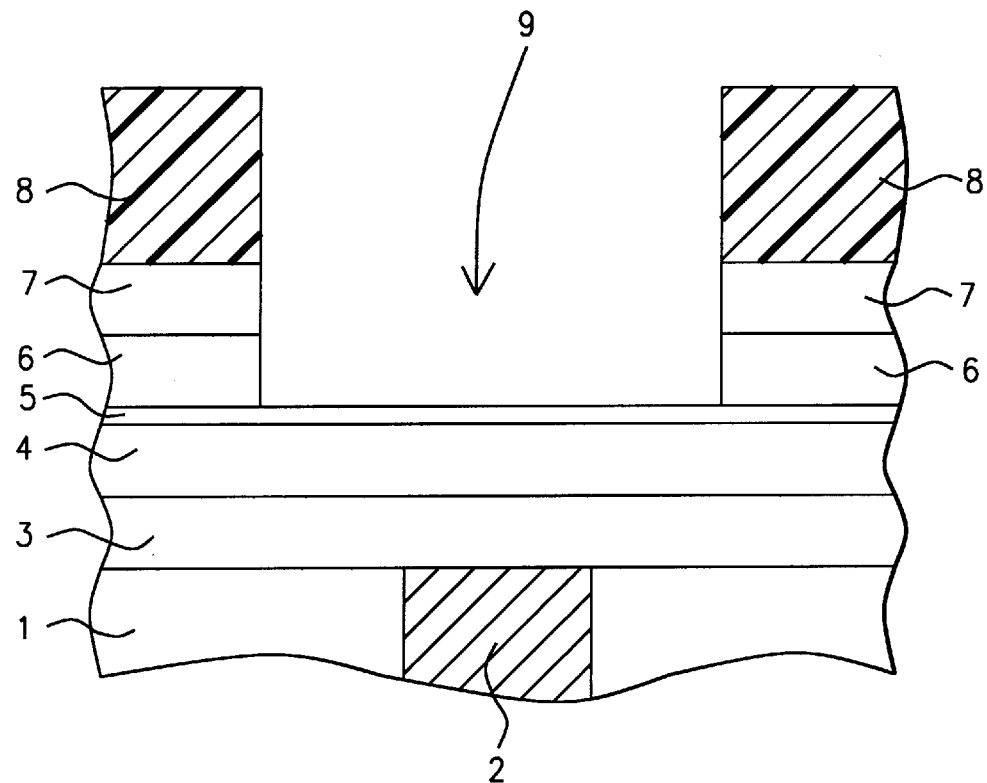

A photoresist shape 8, is used as an mask, to define opening 9, in the upper level, composite insulator layer, via an anisotropic, reactive ion etching, (RIE), procedure, using $C_xH_yF_z$, (such as $CHF_3$), $O_2$, $N_2$, and argon, as etchants for second FSG layer 7, while using the same etchants for second HSQ layer 6. Opening 9, shown schematically in FIG. 3, has a diameter between about 0.1 to 1.0 um, allowing for placement of the subsequent copper interconnect component, of a dual damascene copper structure. The use of $C_xH_yF_z$, (such as $CHF_3$), $O_2$, $N_2$, and argon, as etchants for second HSQ layer 6, allows the desired etch selectivity between second HSG layer 6, and underlying silicon oxynitride layer 5, to be realized. The etch rate ratio of HSQ to silicon oxynitride, in $C_xH_yF_z$, $O_2$, $N_2$, and argon, between about 4 to 1, allows this procedure to be selective, and stop at the appearance of silicon oxynitride layer 5, after defining opening 9, in second FSG layer 7, and in second HSQ layer 6.

Figure 4:
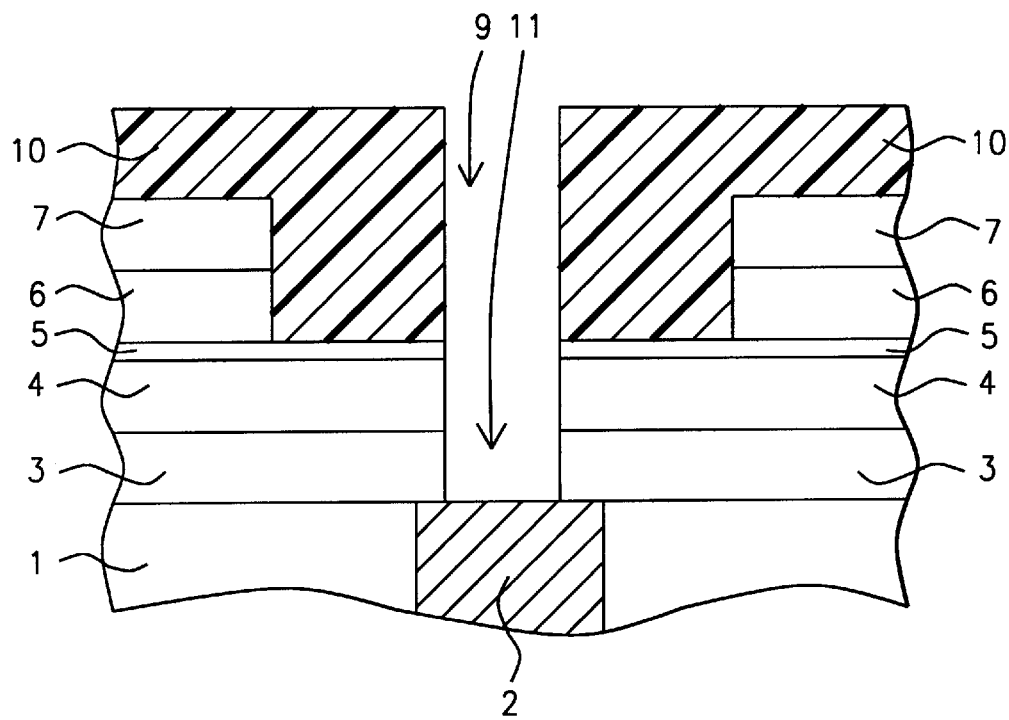

After removal of photoresist shape 8, via plasma oxygen ashing, and careful wet cleans, photoresist shape 10, is employed as a mask, to allow definition of narrow diameter opening 11, to be accomplished in the lower level, composite insulator layer, comprised of first FSG layer 4, and first HSQ layer 3. Narrow opening 11, shown schematically in FIG. 4, and used to accept the subsequent copper via component, of the dual damascene copper structure, is formed via anisotropic RIE procedures, using $C_xH_yF_z$, $O_2$, $N_2$, and argon, as etchants for silicon oxynitride layer 5, for first FSG layer 4, and for first HSQ layer 3. The dual damascene opening, comprised of opening 9, in second FSG layer 7, and in second HSQ layer 6, and comprised of opening 11, in silicon oxynitride layer 5, in first FSG layer 4, and in first HSQ layer 3, exposes a portion of the top surface of lower level, metal interconnect structure 2.

Figure 5:
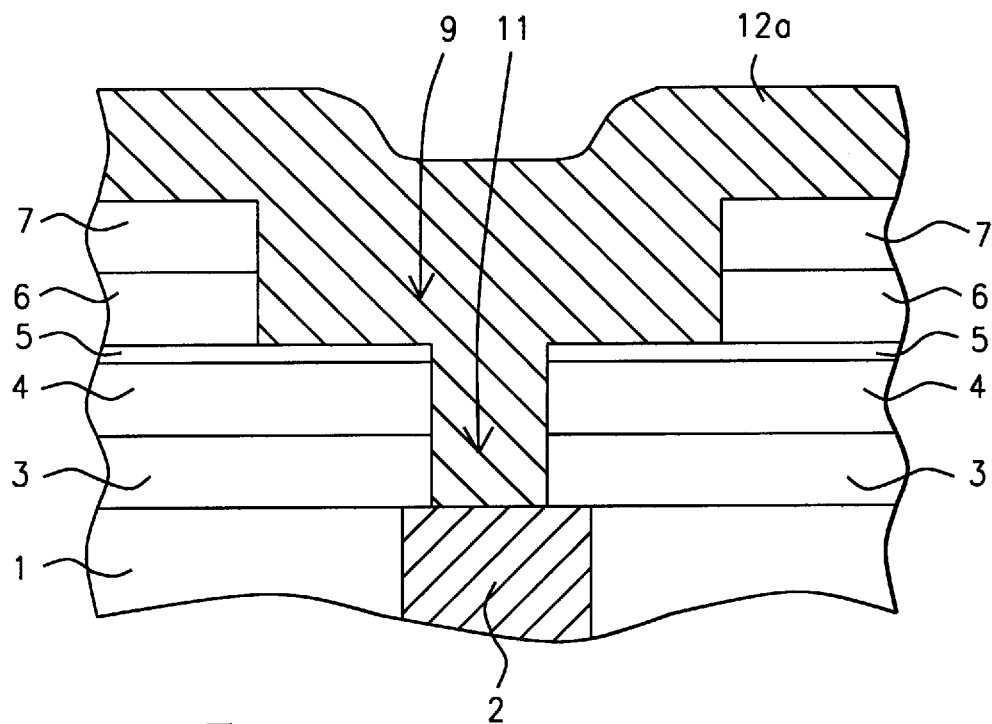
Figure 6:
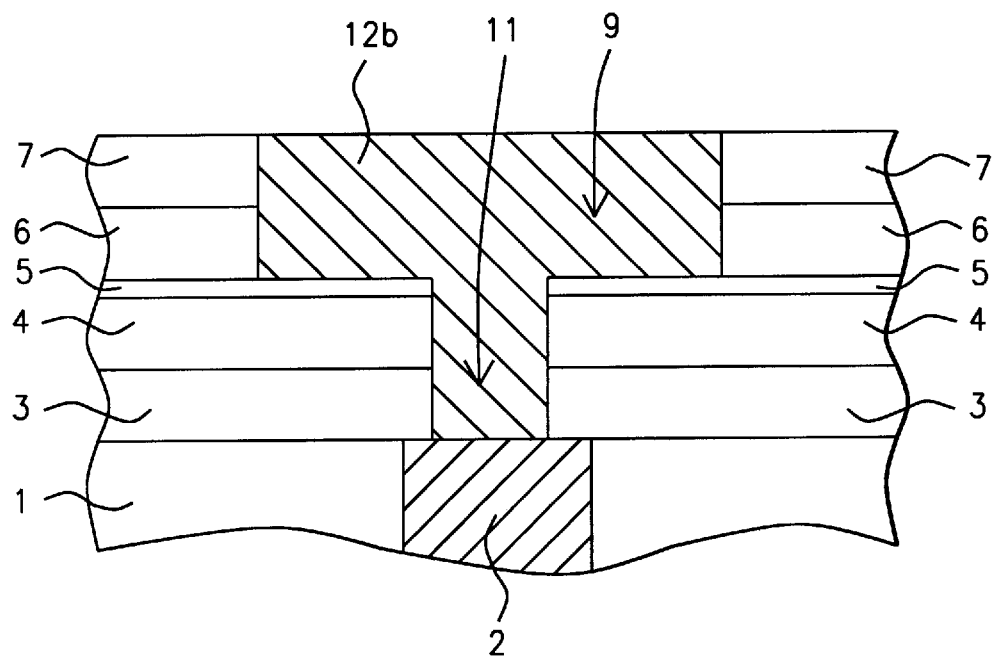

A deposition of a copper layer 12a, is next accomplished via a chemical vapor deposition procedure, or via an electrochemical deposition, (ECD), procedure, using $CuSO_4$ as a source. Copper layer 12a, shown schematically in FIG. 5, is deposited to a thickness between about 1000 to 20000 Angstroms, completely filling the dual damascene opening, comprised of wide diameter opening 9, and narrow diameter opening 11. A tantalum, or tantalum nitride, barrier layer, (not shown in the drawings), deposited via chemical vapor deposition, (CVD), or via a plasma vapor deposition, (PVD), procedure, at a thickness between about 250 to 400 Angstroms, can be formed prior to the copper deposition. A chemical mechanical polishing procedure is used to remove regions of copper layer 12a, (and barrier layer tantalum or tantalum nitride, if used), from the top surface of second FSG layer 7, resulting in the formation of copper damascene structure 12b, in the dual damascene opening. Copper damascene structure 12b, shown schematically in FIG. 6, overlays, and contacts, the region of lower level metal interconnect structure 2, exposed in the dual damascene opening. The portion of copper damascene structure 12b, residing in wide diameter opening 9, is used as a copper interconnect structure, while the portion of copper damascene structure 12b, located in narrow diameter opening 11, is used as a copper via structure. The use of the conductive copper damascene structure 12b, embedded in the low k materials, FSG and HSG, allow performance enhancements to be realized via decreases in RC delays.

While this invention has been particularly shown and described with reference to, the preferred embodiments thereof, it will be understood by those skilled in the art that various changes in form and detail may be made without departing from the spirit and scope of this invention.

What is claimed is:

1. A method of forming a conductive damascene metal structure, in low dielectric constant materials, on a semiconductor substrate, comprising the steps of;

providing a lower level, metal interconnect structure, either embedded in, or residing on, the top surface of an underlying, first insulator layer;

forming a first level, composite insulator layer, on said lower level, metal interconnect structure, and on the top surface of said underlying first insulator layer, with said lower level, composite insulator layer, comprised of an underlying, first type, low dielectric constant layer, and of an overlying, second type, low dielectric constant layer;

depositing a second insulator on the top surface of said lower level, composite insulator layer;

forming a second level, composite insulator layer, on the top surface of said second insulator layer, with said second level, composite insulator layer, comprised of an underlying, said first type, low dielectric layer, and of an overlying, said second type, low dielectric constant layer;

using a first photoresist shape as a mask, to selectively form a wide diameter, first opening, in said second level, composite insulator layer, exposing a portion of the top surface of said second insulator layer;

using a second photoresist shape as a mask, to open a narrow diameter, second opening, in said second insulator layer, and in said first level, composite insulator layer, exposing a portion of said lower level, metal interconnect structure; and forming said conductive damascene metal structure, in a dual damascene opening, comprised of said wide diameter, first opening, and comprised of said narrow diameter, second opening, with said damascene metal structure embedded in said low dielectric materials, comprised of said first level, composite insulator layer, and comprised of said second level, composite insulator layer.

2. The method of claim 1, wherein said first type, low dielectric constant layer, of said first level, composite insulator layer, is a hydrogen silsesquioxane, (HSQ), layer, applied at a thickness between about 2000 to 6000 Angstroms, with a dielectric constant between about 2.8 to 3.0.

3. The method of claim 1, wherein said second type, low dielectric constant layer, of said first level, composite insulator layer, is a fluorinated silicon glass, (FSG), such as silicon oxyfluoride, with a dielectric constant between about 3.5 to 3.7, obtained via PECVD or HDPCVD procedures, at a temperature between about 350 to 450° C., to a thickness between about 1000 to 5000 Angstroms, using $SiF_4$, $SiH_4$, and $O_2$, as reactants.

4. The method of claim 1, wherein said second insulator layer is a silicon oxynitride layer, obtained via PECVD procedures, at a thickness between about 500 to 1000 Angstroms.

5. The method of claim 1, wherein said first type, low dielectric constant layer, of said second level, composite insulator layer, is an HSQ layer, applied at a thickness between about 2000 to 6000 Angstroms, and with a dielectric constant between about 2.8 to 3.0.

6. The method of claim 1, wherein said second type, low dielectric constant layer, of said second level, composite insulator layer, is an FSG layer, such as silicon oxyfluoride, with a dielectric constant between about 3.5 to 3.7, obtained via PECVD or HDPCVD procedures, at a temperature between about 350 to 450° C., to a thickness between about 1000 to 5000 Angstroms, using $SiF_4$, $SiH_4$, and $O_2$, as reactants.

7. The method of claim 1, wherein said wide, first opening, is selectively formed in said second level, composite insulator layer, via an anisotropic RIE procedure, using $C_xH_yF_z$, $O_2$, $N_2$, and argon as etchants for said second type, low dielectric constant layer, and for said first type, low dielectric constant layer, and with an etch rate ratio of said first type, low dielectric constant layer, to said second insulator layer, of about 4 to 1, using $C_xH_yF_z$, $O_2$, $N_2$, and argon, as the etchant for said first type, low dielectric constant layer.

8. The method of claim 1, wherein said narrow diameter opening is formed in said second insulator layer, and in said first level, composite insulator layer, via an anisotropic RIE procedure, using $C_xH_yF_z$, $O_2$, $N_2$, and argon, as etchants for said second insulator layer, for said second type, low dielectric constant layer, and for said first type, low dielectric constant layer.

9. The method of claim 1, wherein said conductive damascene metal structure, is comprised of copper, obtained at a thickness between about 1000 to 20000 Angstroms, via a CVD, or via an ECD procedure, using $CuSO_4$ as a source, then defined via a chemical mechanical polishing procedure.

10. A method of forming a copper damascene structure, in two levels of a low dielectric constant, composite insulator layer, comprising the steps of:

providing a lower level, metal interconnect structure, either embedded in, or residing on, a silicon oxide layer;

applying a first HSQ layer, on said lower level, metal interconnect structure, and on the top surface of said silicon oxide layer;

depositing a first FSG layer, on said first HSQ layer, resulting in a first level, composite insulator layer, comprised of said first FSG layer, overlying said first HSQ layer;

depositing a silicon oxynitride layer, on the top surface of said first level, composite insulator layer;

applying a second HSQ layer, on said silicon oxynitride layer;

depositing a second FSG layer, on said second HSQ layer, creating a second level, composite insulator layer, comprised of said second FSG layer, overlying said second HSQ layer;

selectively forming a wide diameter opening, in said second level, composite insulator layer, exposing a portion of the top surface of said silicon oxynitride layer;

forming a narrow diameter opening, in said silicon oxynitride layer, and in said first level, composite insulator layer, exposing a portion of the top surface of said lower level, metal interconnect structure, and resulting in a dual damascene opening, comprised of said wide diameter opening, and underlying, said narrow diameter opening;

depositing a copper layer, completely filling said dual damascene opening; and removing regions of said copper layer, from the top surface of said second level, composite insulator layer, resulting in said copper damascene structure, in said dual damascene opening.

11. The method of claim 10, wherein said first HSQ layer, with a dielectric constant between about 2.8 to 3.0, is applied at a thickness between about 2000 to 6000 Angstroms.

12. The method of claim 10, wherein said first FSG layer, is a silicon oxyfluoride layer, with a dielectric constant between about 3.7 to 3.9, at a thickness between about 1000 to 5000 Angstroms, obtained via PECVD or HDPCVD procedures, at a temperature between about 350 to 450° C., using $SiF_4$, $SiH_4$, and $O_2$, as reactants.

13. The method of claim 10, wherein said silicon oxynitride layer is obtained via PECVD procedures, at a temperature between about 300 to 450° C., to a thickness between about 500 to 1000 Angstroms.

14. The method of claim 10, wherein said second HSQ layer, with a dielectric constant between about 2.8 to 3.0, is applied at a thickness between about 2000 to 6000 Angstroms.

15. The method of claim 10, wherein said second FSG layer, with a dielectric constant between about 3.7 to 3.9, is a silicon oxyfluoride layer, obtained via PECVD or HDPCVD procedures, at a temperature between about 350 to 450° C., to a thickness between about 1000 to 5000 Angstroms, using $SiF_4$, $SiH_4$, and $O_2$, as reactants.

16. The method of claim 10, wherein said wide diameter opening, is selectively formed in said second level, composite insulator layer, via an anisotropic RIE procedure, using $C_xH_yF_z$, $O_2$, $N_2$, and argon, as etchants for said second FSG layer, and for said second HSQ layer, with an etch rate ratio between said second HSQ layer, and said silicon oxynitride layer, in said $C_xH_yF_z$, $O_2$, $N_2$, and argon, between about 4 to 1.

17. The method of claim 10, wherein said narrow diameter opening, is formed via an anisotropic RIE procedure, using $C_xH_yF_z$, $O_2$, $N_2$, and argon, as etchants for said silicon oxynitride layer, for said first FSG layer, and for said first HSQ layer.

18. The method of claim 10, wherein said copper layer is obtained at a thickness between about 1000 to 20000 Angstroms, via a CVD procedure, or via a ECD procedure, using $CuSO_4$ as a source.

\* \* \* \* \*